United States Patent
Rofougaran

(10) Patent No.: US 9,026,061 B2
(45) Date of Patent: May 5, 2015

(54) WAVEGUIDE FOR INTRA-PACKAGE DATA TRANSFER

(71) Applicant: Broadcom Corporation, Irvine, CA (US)

(72) Inventor: Ahmadreza Rofougaran, Newport Coast, CA (US)

(73) Assignee: Broadcom Corporation, Irvine, CA (US)

( * ) Notice: Subject to any disclaimer, the term of this patent is extended or adjusted under 35 U.S.C. 154(b) by 217 days.

(21) Appl. No.: 13/725,062

(22) Filed: Dec. 21, 2012

(65) Prior Publication Data

US 2014/0154999 A1 Jun. 5, 2014

Related U.S. Application Data

(60) Provisional application No. 61/732,860, filed on Dec. 3, 2012.

(51) Int. Cl.
| | |
|---|---|
| *H04B 1/38* | (2006.01) |
| *H01P 3/12* | (2006.01) |
| *H04B 1/40* | (2006.01) |
| *H01P 5/08* | (2006.01) |
| *H01L 23/00* | (2006.01) |

(52) U.S. Cl.
CPC *H04B 1/40* (2013.01); *H01P 5/087* (2013.01); *H01L 24/80* (2013.01); *H01L 2924/1903* (2013.01)

(58) Field of Classification Search
CPC .. H01L 2924/1903; H01L 24/80; H01P 5/087
USPC ............. 455/41.1, 73, 347, 349; 333/32, 239, 333/260
See application file for complete search history.

(56) References Cited

U.S. PATENT DOCUMENTS

| | | | | |
|---|---|---|---|---|
| 3,986,148 | A | * | 10/1976 | Pollard ............................. 333/2 |
| 4,349,790 | A | * | 9/1982 | Landry ........................ 333/24.1 |
| 4,965,868 | A | * | 10/1990 | Wong et al. .................... 343/756 |
| 5,416,492 | A | * | 5/1995 | Takahashi et al. ............ 343/771 |
| 6,771,935 | B1 | * | 8/2004 | Leggett ......................... 455/66.1 |
| 8,171,191 | B2 | * | 5/2012 | Bruce et al. .................... 710/100 |
| 2004/0080377 | A1 | * | 4/2004 | Chang et al. .................... 333/26 |
| 2005/0116864 | A1 | * | 6/2005 | Mohamadi ............. 343/700 MS |
| 2009/0009337 | A1 | * | 1/2009 | Rofougaran ............... 340/572.7 |
| 2009/0210594 | A1 | * | 8/2009 | Bruce et al. .................... 710/106 |
| 2009/0315637 | A1 | | 12/2009 | Rofougaran |
| 2009/0318105 | A1 | | 12/2009 | Rofougaran et al. |
| 2010/0301973 | A1 | | 12/2010 | Stanec et al. |
| 2010/0308885 | A1 | * | 12/2010 | Rofougaran et al. ......... 327/297 |
| 2012/0068891 | A1 | * | 3/2012 | Haroun et al. ................ 343/702 |
| 2012/0188138 | A1 | * | 7/2012 | Liu ................................ 343/776 |

\* cited by examiner

*Primary Examiner* — Duc M Nguyen

(74) *Attorney, Agent, or Firm* — McDermott Will & Emery LLP

(57) ABSTRACT

An integrated chip (IC) package may include a waveguide that comprises a cavity, a first chip and a second chip. The first chip includes a first radio frequency (RF) transceiver that may be coupled to a first probe that extends into the cavity of the waveguide and/or a first antenna that is positioned over a first opening in the waveguide. The second chip includes a second RF transceiver that may be coupled to a second probe that extends into the cavity of the waveguide and/or a second antenna that is positioned over a second opening in the waveguide. The first and second chips may be configured to communicate with one another exclusively by the first and second RF transceivers transmitting and receiving RF signals through the cavity of the waveguide via the first and second probes and/or the first and second antennas.

20 Claims, 8 Drawing Sheets

US 9,026,061 B2

WAVEGUIDE FOR INTRA-PACKAGE DATA TRANSFER

CROSS-REFERENCE TO RELATED APPLICATIONS

The present application claims the benefit of U.S. Provisional Patent Application Ser. No. 61/732,860, entitled "Waveguide for Intra-Package Data Transfer," filed on Dec. 3, 2012, which is hereby incorporated by reference in its entirety for all purposes.

TECHNICAL FIELD

The present description relates generally to waveguides, and more particularly, to a waveguide for intra-package data transfer.

BACKGROUND

Multiple chips or dies may be packaged together in a multi-chip integrated circuit (IC) package. The chips in the IC package may lie on a substrate and communicate with one another via a complex network of conductive lines on and/or within the substrate.

BRIEF DESCRIPTION OF THE DRAWINGS

Certain features of the subject technology are set forth in the appended claims. However, for purpose of explanation, several embodiments of the subject technology are set forth in the following figures.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, the subject technology is not limited to the specific details set forth herein and may be practiced without one or more of the specific details. In some instances, structures and components are shown in block diagram form in order to avoid obscuring the concepts of the subject technology.

Figure 1:
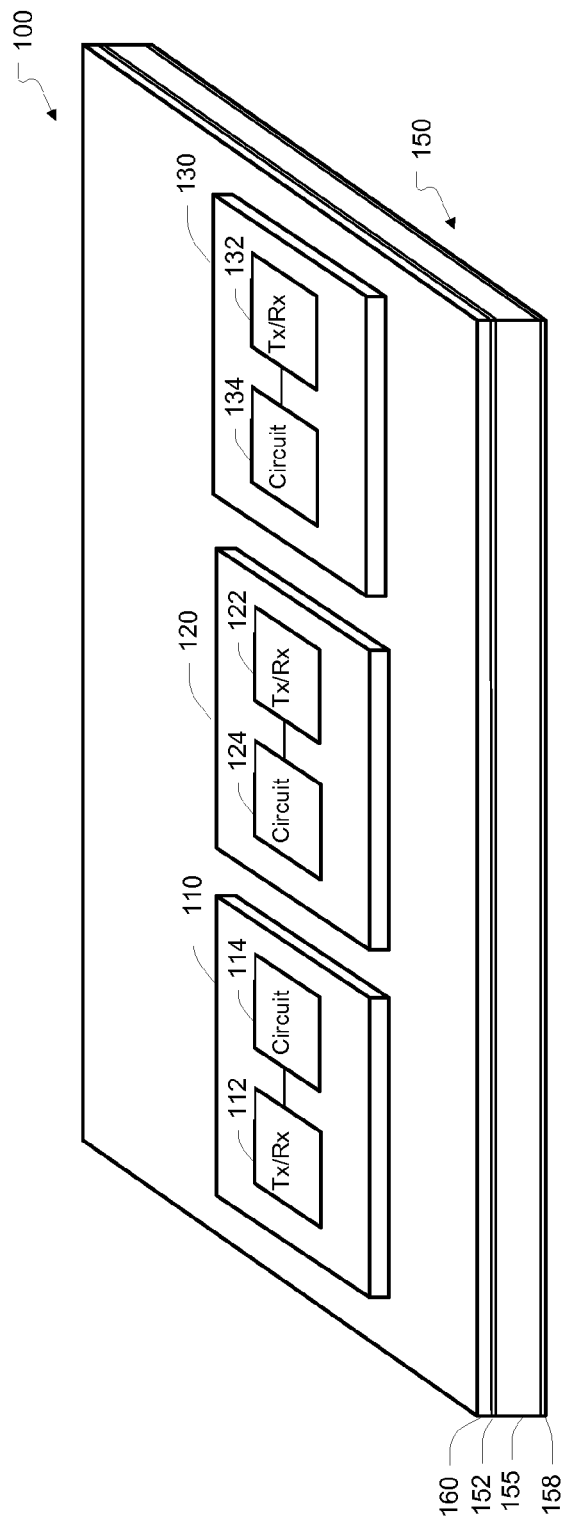
FIG. 1 illustrates an example of a multi-chip IC package according to aspects of the subject technology.

FIG. 1 shows an example IC package 100 according to some aspects of the subject technology. The IC package 100 includes multiple chips or dies 110, 120 and 130, and a waveguide 150. The waveguide 150 may be a rectangular-metal waveguide including a top metal layer 152, a bottom metal layer 158, and a dielectric layer 155 between the top and bottom metal layers 152 and 158. Alternatively, the waveguide 150 may have an open-air space between the top and bottom metal layers 152 and 158. The top and bottom metal layers 152 and 158 may be made of other conductive materials besides metal, such as highly-doped polysilicon.

In one or more implementations, the height of the waveguide, e.g. the distance between the top and bottom metal layers 152 and 158, may be of the same order of magnitude as the wave to be guided by the waveguide 150, and/or may be proportional to the wavelength of the wave to be guided by the waveguide 150. Alternatively, or in addition, the lengths and/or widths of the top and bottom metal layers 152 and 158 may be the same order of magnitude as the wave to be guided by the waveguide 150, and/or may be proportional to the wavelength of the wave to be guided by the waveguide 150. In one or more implementations, the top metal layer 152 may have a different width and/or length as the bottom metal layer 158.

The chips 110, 120 and 130 may be placed on top of the waveguide 150 with one or more intervening layers 160 between the chips 110, 120 and 130 and the waveguide 150, as shown in the example in FIG. 1. Thus, the waveguide 150 may be part of a support structure or substrate on which the chips 110, 120 and 130 are mounted. The one or more intervening layers 160 may include an insulating layer to electrically isolate the chips 110, 120 and 130 from the metal layers 152 and 158 of the waveguide 150.

Each chip 110, 120 and 130 may include a functional circuit 114, 124 and 134, and a radio frequency (RF) transceiver 112, 122 and 132, respectively. The RF transceivers 112, 122 and 132 enable the functional circuits 114, 124 and 134 to communicate with one another via the waveguide 150 by injecting RF electromagnetic waves into the waveguide 150 and receiving RF electromagnetic waves in the waveguide 150.

Figure 2:
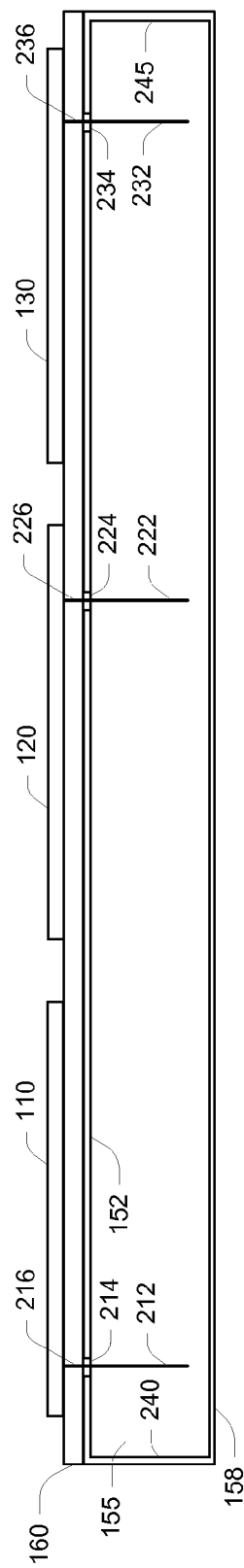
FIG. 2 illustrates a cross-sectional view of an example waveguide according to aspects of the subject technology.

In some implementations, the RF transceivers 112, 122 and 132 are coupled to probes or stubs 212, 222 and 232, respectively, within the waveguide 150, as shown in FIG. 2. Each probe 212, 222 and 232 may extend into the cavity of the waveguide 150 in a direction substantially perpendicular to the top and bottom metal layers 152 and 158. Any one of the probes 212, 222 and 232 may be fabricated by forming a via in the dielectric layer 155 of the waveguide 150, and depositing metal or another conductive material into the via. Each RF transceiver 112, 122 and 132 may be coupled to the respective probe 212, 222 and 232 through a respective opening 214, 224 and 234 in the top metal layer 152.

In some implementations, the chips 110, 120 and 130 may be flip-chip mounted on the intervening layer 160. Any one of the chips 110, 120 and 130 may include a surface contact (not shown) coupled to the respective RF transceiver 112, 122 and 132 (e.g., by metal interconnects). The contact may be coupled to the respective probe 212, 222 and 232 by a via 216, 226 and 236 through the intervening layer 160.

Referring back to FIG. 1, any one of the functional circuits 114, 124 and 134 may include one or more of a wireless local area network (WLAN) transceiver, a Bluetooth transceiver, a cellular transceiver, a baseband processor, a microprocessor, a hardware accelerator (e.g., a graphics accelerator), and a memory. The functional circuits 114, 124 and 134 communicate with one another via the respective RF transceivers 112, 122 and 132 and the waveguide 150.

When the functional circuit 114, 124 or 134 of one of the chips 110, 120 or 130 needs to send a signal (e.g., data and/or controls) to another functional circuit 114, 124 or 134 of another chip 110, 120 or 130, the respective RF transceiver 112, 122 or 132 processes the signal into an RF signal. The processing may include one or more of modulation, frequency up-conversion, and power amplification. The RF transceiver 112, 122 or 132 drives the respective probe 212, 222 and 232 with the RF signal. This causes the probe to inject a corresponding RF electromagnetic wave into the waveguide 150. The RF electromagnetic wave propagates within the waveguide 150 to the other probes. The RF signal may have a carrier frequency within a range of one GHz to 100 GHz, or another frequency range.

At the other chip 110, 120 or 130, the respective probe 212, 222 or 232 receives the RF electromagnetic wave, and outputs a corresponding RF signal to the respective RF transceiver 112, 122 or 132. The RF transceiver 112, 122 or 132 may process the received RF signal into a form (e.g., a baseband signal) that can be processed by the respective functional circuit 114, 124 or 134. The processing by the RF transceiver may include one or more of low-noise amplification, frequency down-conversion, and demodulation.

Referring to FIG. 2, in some implementations, the waveguide 150 may include a first sidewall 240 and a second sidewall 245, in which one or both of the sidewalls 240 and 245 may be shorted. The probe 212 for chip 110 may be positioned about ¼ of a wavelength from the first sidewall 240 for a given RF electromagnetic wave. This arrangement may cause the electric field of the RF electromagnetic wave to be at a maximum at the probe 212, which increases power transfer between the probe and the waveguide. Similarly, the probe 232 for chip 130 may be position about ¼ of a wavelength from the second sidewall 245 for the desired RF electromagnetic wave. The probe 222 for chip 120 may be positioned a distance approximately equal to a multiple of a wavelength from the probe 212 for chip 110 and/or the probe 232 for chip 130.

The sidewalls 240 and 245 may be fabricated by plating one or more edges of the dielectric layer 155 with metal. Alternatively, the sidewalls 240 and 245 may be implemented using one or more rows of closely spaced metal posts in the dielectric layer 155, in which each post may extend from the bottom metal layer 158 to the top metal layer 152. Each metal post may be fabricated by forming a via in the dielectric layer 155, and depositing metal into the via. Generally speaking, a row of closely spaced metal posts may be formed in the dielectric layer 155 to define a sidewall of the waveguide 150. In one or more implementations, the height of the waveguide 150, e.g. the length of the closely spaced metal posts, may be the same order of magnitude as the wave to be guided by the waveguide 150, and/or may be proportional to the wavelength of the wave to be guided by the waveguide 150.

Thus, the waveguide 150 provides a medium for communicating RF signals between the chips 110, 120 and 130 in the IC package 100. The waveguide 150 confines the propagation of RF electromagnetic waves between the chips, providing for efficient communication between the chips. The waveguide 150 enables the chips to communicate with one another without the need for a complex network of conductive lines on and/or within a substrate of the IC package.

Figure 3:
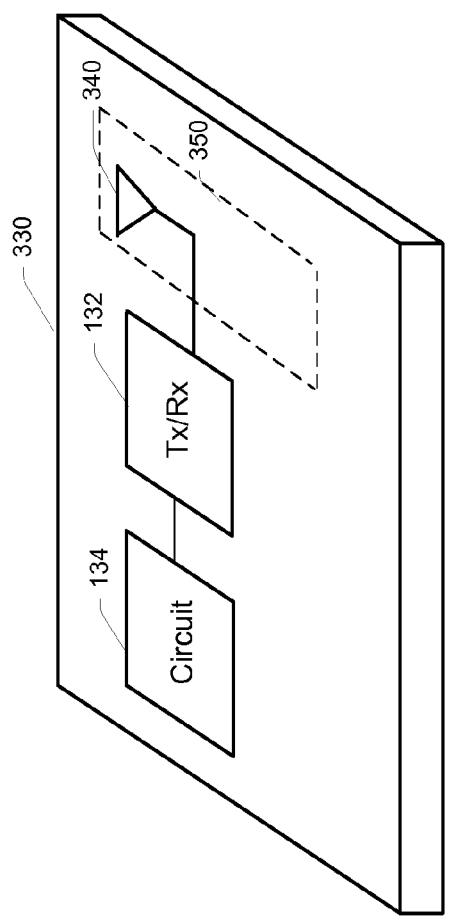
FIG. 3 illustrates an example of chip that includes an antenna according to aspects of the subject technology.

In some implementations, a chip may include an antenna for transmitting an RF electromagnetic wave into the waveguide 150 and/or receiving an RF electromagnetic wave from the waveguide 150. In this regard, FIG. 3 shows an example chip 330 including an antenna 340 coupled to the respective RF transceiver 132. The antenna 340 may be a dipole antenna or another type of antenna, and may be fabricated on the chip 330 using microstrips and/or another technique. The antenna 340 may be positioned above an opening 350 in the top layer 152 of the waveguide 150.

To transmit an RF electromagnetic wave into the waveguide 150, the RF transceiver 132 may drive the antenna 340 with an RF signal to emit a corresponding RF electromagnetic wave. A portion of the RF electromagnetic wave may couple into the waveguide 150 through the opening 350, and propagate within the waveguide 150 to one or more of the other chips.

When an RF electromagnetic wave within the waveguide 150 propagates towards the chip 330, a portion of the RF electromagnetic wave may radiate out of the opening 350 of the waveguide 150. In some implementations, the opening may be a slot that radiates the RF electromagnetic wave as a narrow RF beam. The antenna 340 receives the radiated RF electromagnetic wave, and outputs a corresponding RF signal to the RF transceiver 132.

The chip 330 may include the antenna 340 in addition to a probe or in the alternative to a probe. For example, the chip may inject an RF electromagnetic wave into the waveguide using a probe and receive an RF electromagnetic wave through an opening in the waveguide using an antenna.

In some implementations, an RF electromagnetic wave in the waveguide 150 may be directed to a particular chip 110, 120 or 130 in the IC package 100 using time division multiplexing (TDM), frequency division multiplexing (FDM), code division multiplexing (CDMA), packet-based addressing, or another technique.

For TDM implementations, the chips 110, 120 and 130 may be assigned different time slots, and each chip may listen for an RF electromagnetic wave during its assigned time slots. When a functional circuit 114, 124 or 134 of one of the chips 110, 120 or 130 needs to send a signal (e.g., data and/or controls) to another functional circuit 114, 124 or 134 of another chip 110, 120 or 130, the respective RF transceiver 112, 122 or 132 may transmit the corresponding RF electromagnetic wave in the waveguide 150 in a time slot assigned to the other chip. The other chip listens for the RF electromagnetic wave during the time slot (which is assigned to the other chip), and therefore receives the RF electromagnetic wave.

One of the functional circuits 114, 124 or 134 may manage TDM communication among the chips. The functional circuit may do this by assigning time slots to the chips 110, 120 or 130, and communicating the assigned time slots to the other chips in the IC package 100 via the respective RF transceiver 112, 122 or 132 and the waveguide 150. The chips 110, 120 and 130 may be time synchronized, for example, by sending a clock signal from one of the chips to the other chips in the package via the waveguide 150.

For FDM implementations, the chips 110, 120 and 130 may be assigned different RF or carrier frequencies, and each chip may listen for an RF electromagnetic wave in the waveguide 150 at its assigned RF frequency. When a functional circuit 114, 124 or 134 of one of the chips 110, 120 or 130 needs to send a signal to another functional circuit 114, 124 or 134 of another chip 110, 120 or 130, the respective RF transceiver 112, 122 or 132 may transmit the corresponding RF electromagnetic wave at the RF frequency assigned to the other chip.

One of the functional circuits 114, 124 or 134 may manage FDM communication among the chips. The functional circuit may do this by assigning RF frequencies to the chips 110, 120 or 130, and communicating the assigned RF frequencies to the other chips via the respective RF transceiver 112, 122 or 132 and the waveguide 150.

For CDMA implementations, the chips 110, 120 and 130 may be assigned different codes (e.g., orthogonal codes). When a functional circuit 114, 124 or 134 of one of the chips 110, 120 or 130 needs to send a signal to another functional circuit 114, 124 or 134 of another chip 110, 120 or 130, the respective RF transceiver 112, 122 or 132 may spread the signal with the code assigned to the other chip, and transmit the corresponding RF electromagnetic wave in the waveguide 150. The other chip may receive the RF electromagnetic wave, and despread the RF signal using a corresponding locally-generated code to recover the un-coded signal.

For packet-based addressing implementations, the chips 110, 120 and 130 may be assigned different addresses. When a functional circuit 114, 124 or 134 of one of the chips 110, 120 or 130 needs to send data to another functional circuit 114, 124 or 134 of another chip 110, 120 or 130, the functional circuit 114, 124 or 134 may encapsulate the data into a packet addressed to the other chip. The functional circuit 114, 124 or 134 may address the packet to the other chip by including the address of the other chip in a header of the packet. The respective RF transceiver may then process the packet into an RF signal and transmit the corresponding RF electromagnetic wave in the waveguide 150.

The other chip 110, 120 or 130 may receive the packet via the respective RF transceiver 112, 122 or 132. The respective functional circuit 114, 124 or 134 may then compare the address in the header of the packet with its address. If there is a match, then the functional circuit 114, 124 or 134 processes the data in the packet.

In some implementations, any one of the RF transceivers 112, 122 and 132 may include one or more impedance matching circuits for matching an input and/or output impedance of the RF transceiver with the impedance of the respective probe and/or antenna. Impedance matching may be used to improve the transfer of RF power to and/or from the probe and/or antenna.

Figure 4:
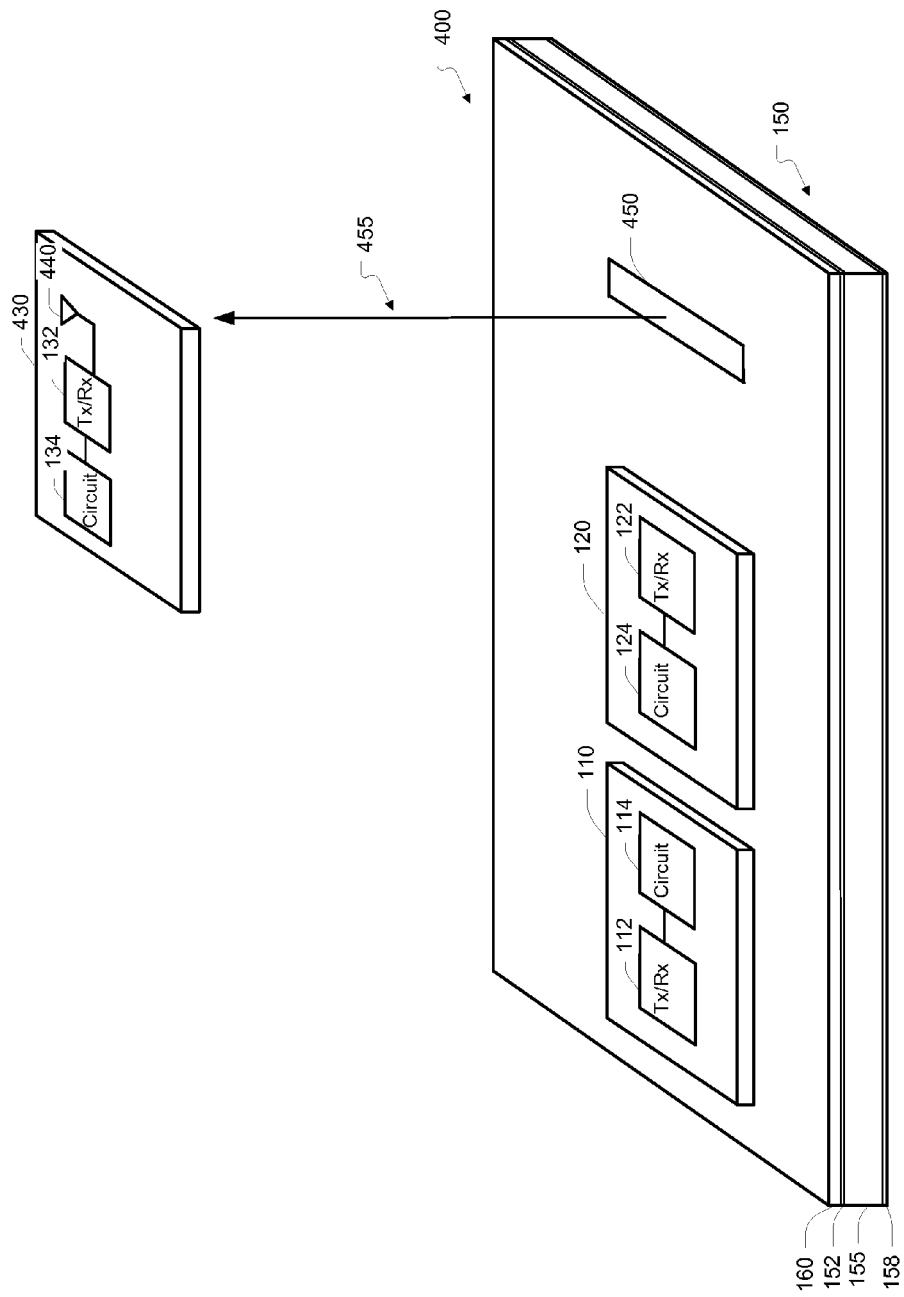
FIG. 4 illustrates an example waveguide with a slot that radiates a radio frequency (RF) electromagnetic wave according to aspects of the subject technology.

In some implementations, the waveguide 150 may be used to transmit an RF electromagnetic wave from one of the chips to a chip located outside of the IC package. FIG. 4 shows an example of an IC package 400, in which waveguide 150 has an opening 450 for transmitting an RF wave to chip 430 located outside of the IC package 400. Chip 430 may be located on the same device (e.g., computing device, mobile device, etc.) as the IC package 400 or a different device. Chip 430 may include an RF transceiver 132 and an antenna 440 coupled to the RF transceiver 132. Alternatively, the antenna 440 may be an off-chip antenna coupled to the RF transceiver 132 (e.g., via a transmission line).

When a functional circuit 114 or 124 needs to send a signal (e.g., data and/or instructions) to chip 430, the respective RF transceiver 112 or 122 processes the signal into an RF signal. The processing may include modulation, frequency up-conversion, and power amplification. The RF transceiver 112 and 122 then transmits a corresponding RF electromagnetic wave in the waveguide 150 via a probe or an antenna.

The RF electromagnetic wave propagates within the waveguide 150 to the opening 450 in the top layer 152 of the waveguide 150. A portion of the RF electromagnetic wave radiates out of the opening 450. In some implementations, the opening 450 is a slot that radiates the RF signal as a narrow RF beam. Although one slot is shown in the example in FIG. 4, it is to be appreciated that the waveguide 150 may include any number of slots. The narrow RF beam concentrates the power of RF electromagnetic wave in a particular direction (shown as arrow 455 in FIG. 4).

The antenna 440 of chip 430 (which may be positioned in the path of the narrow RF beam) receives the RF electromagnetic wave radiated from opening 450. The RF transceiver 132 of chip 430 processes the corresponding RF signal into a form (baseband) that can be processed by the respective functional circuit 134. The processing may include low-noise amplification, frequency down-conversion, and demodulation.

Thus, the waveguide 150 can act as a slotted-waveguide antenna to transmit an RF electromagnetic wave to a chip located outside the IC package 400. This enables the waveguide to provide inter device and/or intra device communication.

Figure 5:
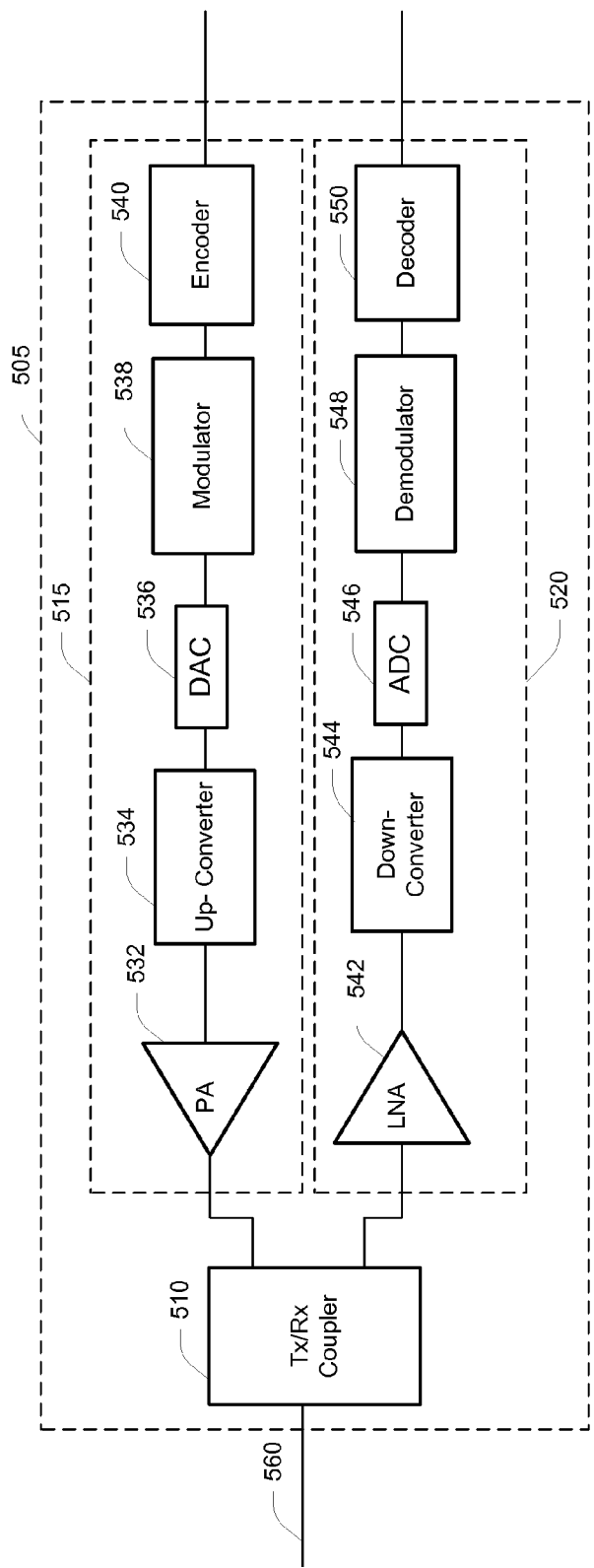
FIG. 5 illustrates an example transceiver according to aspects of the subject technology.

FIG. 5 shows a block diagram of an RF transceiver 505 according to aspects of the subject technology. The RF transceiver 505 may be used to implement any one of the RF transceivers 112, 122 and 132 shown in FIG. 1, and may be coupled to a respective probe and/or antenna via an input/output (I/O) 560. The RF transceiver 505 includes a transmitter 515, a receiver 520, and a Tx/Rx coupler 510. The Tx/Rx coupler 510 couples the transmitter 515 and the receiver 520 to the respective probe and/or antenna while isolating the transmitter 515 from the receiver 520. The Tx/Rx coupler 510 may be implemented using one or more switches that selectively couple the transmitter 515 and the receiver 520 to the respective probe and/or antenna, a duplexer, one or more filters, etc.

The transmitter 515 may include an encoder 540, a modulator 538, a digital-to-analog converter (DAC) 536, a frequency up-converter 534, and a power amplifier (PA) 532. The encoder 540 receives an input signal (e.g., data signal) from the respective functional circuit. The input signal may include data (e.g., voice, video, text, etc.) to be transmitted to another functional circuit of another chip in the package. The encoder 540 encodes the input signal (e.g., error-correction coding, turbo coding, etc.). The modulator 538 modulates the encoded signal using any one of a variety of modulation schemes, such as amplitude modulation (AM), frequency modulation (FM), phase modulation (PM), amplitude shift keying (ASK), phase shift keying (PSK), quadrature PSK (QPSK), frequency shift keying (FSK), quadrature amplitude modulation (QAM), or another modulation scheme.

The encoder 540 and the modulator 538 may perform encoding and modulation, respectively, in the digital domain, and may be implemented using a digital signal processor (DSP). Although the encoder 540 and the modulator 538 are shown in FIG. 5 as being part of the RF transceiver 505, it should be appreciated that one or more functions of the encoder 540 and modulator 538 may be performed by the respective functional circuit (e.g., when the functional circuit includes a DSP).

The DAC 536 coverts the modulated signal output by the modulator 538 into an analog modulated signal. The analog modulated signal may be at baseband. The frequency un-converter 534 performs frequency up-conversion on the modulated signal to convert the modulated signal into an RF signal. The RF signal may have a frequency within a range of one GHz to 100 GHz. The frequency up-converter 534 may up-convert the frequency of the modulated signal by mixing the modulated signal with a local oscillator signal. The PA 532 amplifies the RF signal. The PA 532 may be omitted if the RF signal already has sufficient power. The Tx/Rx coupler 510 couples the RF signal output by the PA 532 to respective probe and/or antenna.

The receiver 520 includes a low-noise amplifier (LNA) 542, a frequency down-converter 544, an analog-to-digital converter (ADC) 546, a demodulator 548, and a decoder 550. The Tx/Rx coupler 510 couples a receive RF signal from the respective probe and/or antenna to the LNA 542. The LNA

542 amplifies the receive RF signal. The LNA 542 may be omitted if the receive RF signal has sufficient power to be detected at the receiver 520. The frequency down-converter 544 performs frequency down-conversion on the RF signal to convert to the RF signal to a baseband signal. The ADC 546 converts the baseband signal into a digital baseband signal.

The demodulator 548 demodulates the baseband signal in accordance with the modulated scheme used by the corresponding transmitter. The decoder 550 decodes the demodulated signal, and outputs the decoded signal to the respective functional circuit for further processing. The receiver 520 may include one or more additional amplifier stages (not shown), and/or a filter (not shown) to, for example, remove out-of-band signals.

The demodulator 548 and the decoder 550 may be implemented using a digital signal processor (DSP). Although the demodulator 548 and the decoder 550 are shown in FIG. 5 as being part of the RF transceiver 505, it should be appreciated that one or more functions of the demodulator 548 and decoder 550 may be performed by the respective functional circuit (e.g., when the functional circuit includes a DSP).

Figure 6:
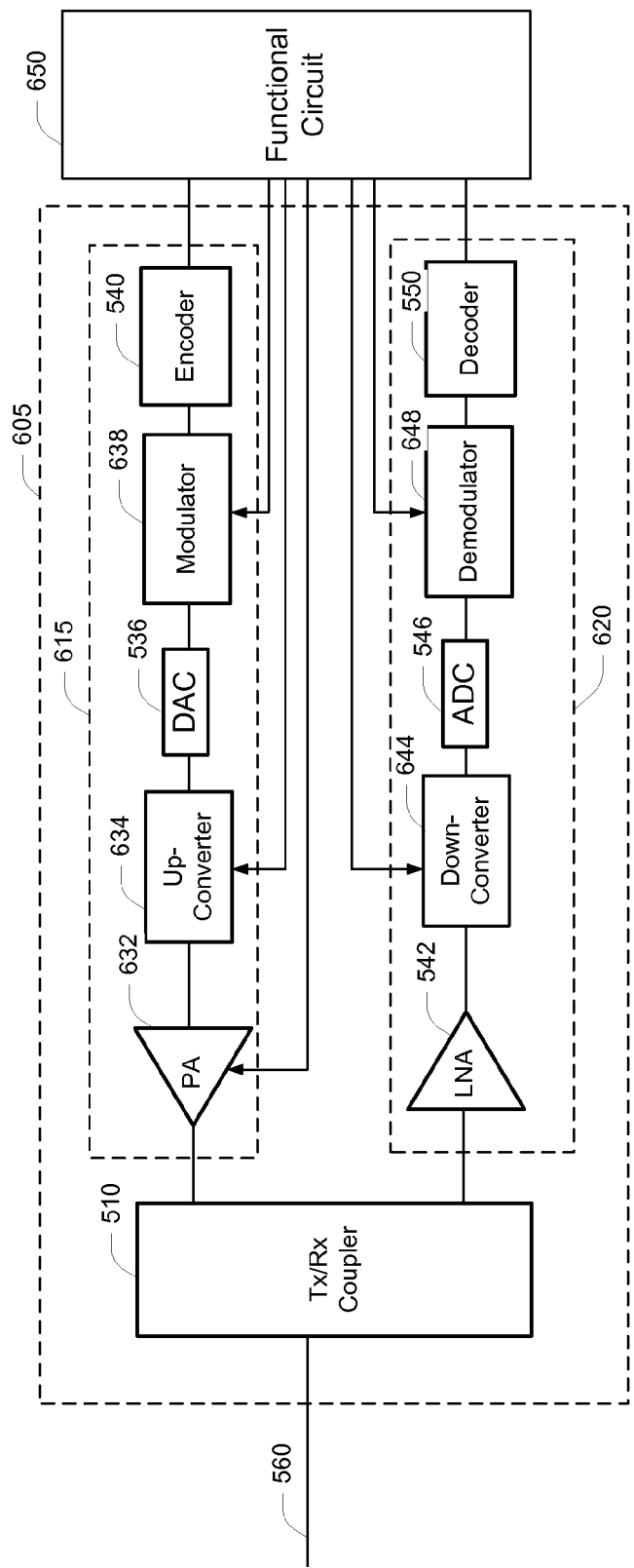
FIG. 6 illustrates an example transceiver with adjustable parameters according to aspects of the subject technology.

FIG. 6 shows a block diagram of an RF transceiver 605 according to aspects of the subject technology. The RF transceiver 605 may be used to implement any one of the RF transceivers 112, 122 and 132 shown in FIG. 1, and may be coupled to the respective probe and/or antenna via the I/O 560.

The RF transceiver 605 includes a transmitter 615, a receiver 620, and the Tx/Rx coupler 510. The transmitter 615 may include an adjustable power amplifier (PA) 632 having an adjustable output power. The output power of the PA 632 may be adjusted by adjusting a bias voltage in the PA 632, or another technique.

The transmitter 615 may also include an adjustable up-converter 634 having an adjustable frequency. In some implementations, the adjustable up-converter 634 may include a frequency synthesizer that outputs a reference signal having an adjustable frequency, and a mixer that mixes the modulated signal with the reference signal to up-convert the modulated signal. The frequency of the reference signal may be made adjustable using a voltage-controlled oscillator (VCO), a programmable frequency divider, and/or another technique. The functional circuit 650 may adjust the frequency of the RF signal by adjusting the frequency of the reference signal output by the frequency synthesizer accordingly. Thus, the functional circuit 650 may tune the frequency of the RF signal by adjusting the frequency of the reference signal. For example, the functional circuit 650 may tune the frequency to a frequency assigned to the respective chip in FDM implementations.

The transmitter 615 may also include an adjustable modulator 638 having an adjustable modulation scheme. The adjustable modulator 638 may support different modulation schemes, and the functional circuit 650 may instruct the adjustable modulator 638 which of the modulation schemes to use to modulate a signal. In some implementations, the adjustable modulator 638 may support different levels of modulation (e.g., QPSK, 16 QAM, 64-QAM, and 256-QAM), and the functional circuit 650 may instruct the adjustable modulator 638 which level of modulation to use to modulate a signal. Higher levels of modulation may be capable of providing high throughput, while lower levels of modulation may be more robust to interference and distortion.

The receiver 620 may also include an adjustable down-converter 644 having an adjustable frequency. In some implementations, the adjustable down-converter 644 may include a frequency synthesizer that outputs a reference signal having an adjustable frequency, and a mixer that mixes a received RF signal with the reference signal to down-convert the RF signal (e.g., to baseband). The functional circuit 650 may tune the frequency of a receive RF signal by adjusting the reference signal output by the frequency synthesizer accordingly.

The receiver 620 may also include an adjustable demodulator 648 having an adjustable demodulation scheme. The adjustable demodulator 648 may support different demodulation schemes, and the functional circuit 650 may instruct the adjustable demodulator 648 which of the demodulation schemes to use to demodulate a signal. For example, the functional circuit 650 may instruct the adjustable demodulator 648 to use a demodulation scheme corresponding to the modulation scheme used to modulate the corresponding signal.

In some implementations, the functional circuit 650 may be configured to adjust the transmission power of the RF transceiver 605 based on the data rate of the signal to be transmitted. To do this, the functional circuit 650 may adjust the output power of the PA 632 based on the data rate of the signal to be transmitted. The functional circuit 650 may reduce the output power of the PA 632 for lower data rates since lower data rates may be more reliability transmitted at lower power than higher data rates.

In some implementations, the functional circuit 650 may be configured to adjust the transmission power of the RF transceiver 605 based on an error rate (e.g., frame error rate) reported by the receiving chip. The functional circuit 650 may receive the error rate via the waveguide 150. The functional circuit 650 may then compare the reported error rate with a threshold. When the reported error rate exceeds the threshold, the functional circuit 650 may increase the output power of the PA 632 to reduce the error rate.

In some implementations, the functional circuit 650 may adjust the level of modulation used by the adjustable modulator 638 based on the data rate to be transmitted. The functional circuit 650 may instruct the adjustable modulator 638 to use a higher level of modulation for higher data rates.

In some implementations, the functional circuit 650 may adjust the level of modulation used by the adjustable modulator 638 based on an error rate reported by the receiving chip. A lower level of modulation may be more robust than a higher level of modulation at the expense of less throughput. Thus, when the error rate reported by the receiving chip exceeds a threshold, the functional circuit 650 may instruct the adjustable modulator 638 to reduce the level of modulation to reduce the error rate.

In the above implementations, the portion of the functional circuit 650 that controls the various parameters of the RF transceiver 605 may be referred to as a controller.

Figure 7A:
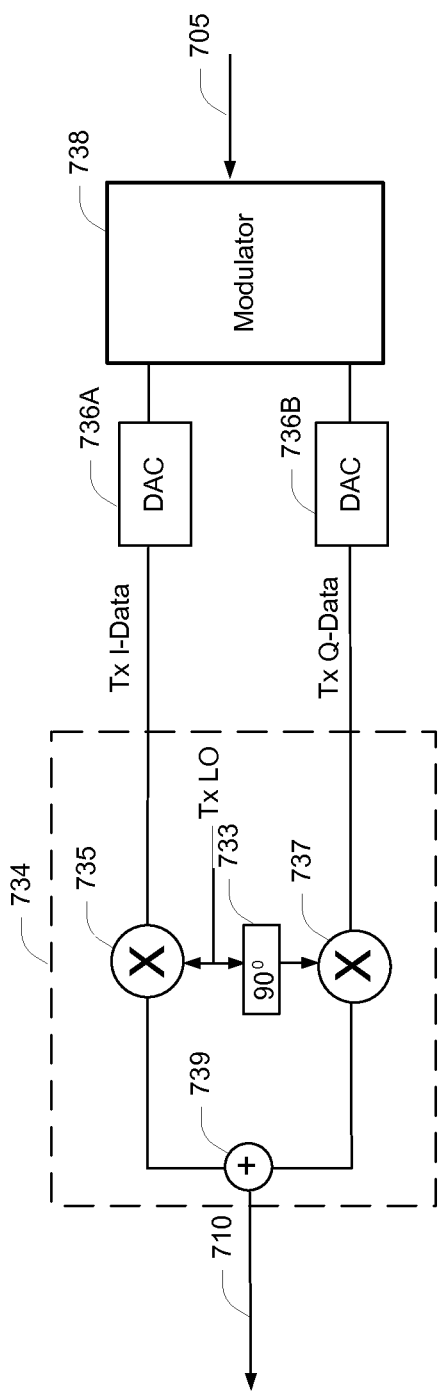
FIG. 7A illustrates an example transmitter according to aspects of the subject technology.

FIG. 7A shows a frequency up-converter 734 and a modulator 738 according to aspects of the subject technology. The up-converter 734 and the modulator 738 may be used in any of the transmitters 515 and 615 shown in FIGS. 5 and 6. The modulator 738 receives a signal 705 to be transmitted via the waveguide 150. The signal 705 may be from the encoder 540 or another circuit. The modulator 738 modulates the signal using an inphase-quadrature (I-Q) modulation scheme, such as QPSK, 16 QAM, 64-QAM, and 256-QAM. The modulator 738 outputs transmit (Tx) inphase (I)-data and transmit (Tx) quadrature (Q)-data, both in the digital domain. Digital-to-analog converters (DACs) 736A and 736B convert the Tx I-data and the Tx-Q data, respectively, into analog signals. The analog Tx I-data and Tx Q-data may be at baseband.

The frequency up-converter 734 includes a first mixer 735, a second mixer 737, a 70-degree phase shifter 733, and a combiner 739. The first mixer 735 mixes the Tx I-data with a transmit local oscillator (TxLO) signal to up-convert the Tx I-data. The 70-degree phase shifter 733 shifts the TxLO signal by 90 degrees. The second mixer 737 mixes the Tx Q-data with the phase-shifted TxLO signal to up-convert the Tx Q-data. The combiner 739 combines the up-converted Tx I-data and the up-converted Tx-Q data to produce the RF signal 710 to be transmitted via the waveguide 150.

Figure 7B:
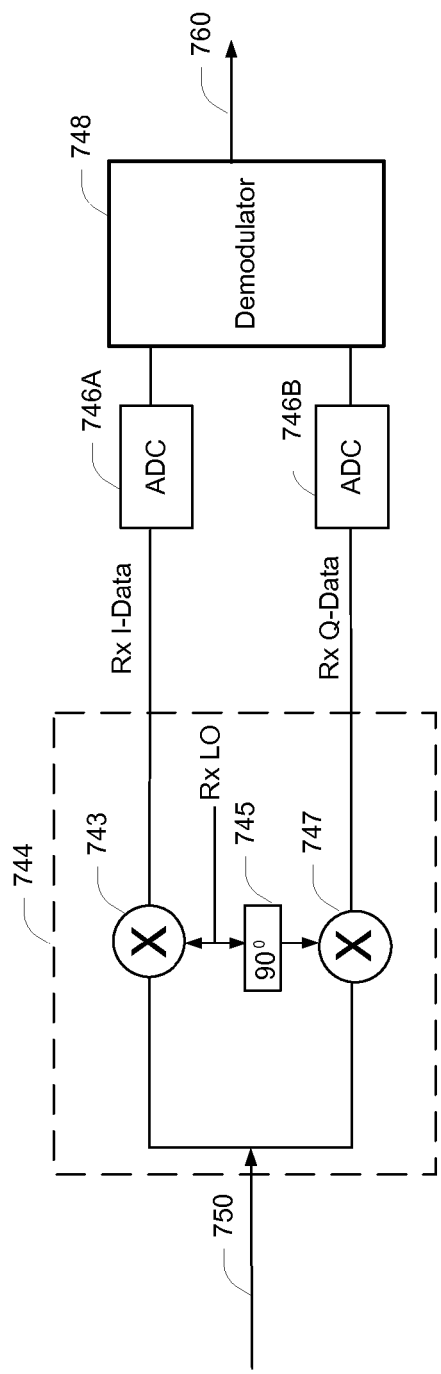
FIG. 7B illustrates an example receiver according to aspects of the subject technology.

FIG. 7B shows a frequency down-converter 744 and a demodulator 748 according to aspects of the subject technology. The down-converter 744 and the demodulator 748 may be used in any of the receivers shown in FIGS. 5 and 6.

The frequency down-converter 744 includes a first mixer 743, a second mixer 747, and 90-degree phase shifter 745. The first mixer 743 mixes a receive RF signal 750 with a receive local oscillator (RxLO) signal to down-convert the RF signal 750 into receive (Rx) I-data. The 90-degree phase shifter 745 shifts the RxLO signal by 90 degrees. The second mixer 747 mixes the receive RF signal 750 with the phase-shifted RxLO signal to down-convert the RF signal into Rx Q-data. The receive RF signal 750 may be output by the LNA of the receiver, and the Rx I-data and Rx Q-data may be at baseband.

The Rx I-data and Rx Q-data may be digitized by analog-to-digital converters 746A and 746B, respectively. The demodulator 748 demodulates the digital Rx I-data and digital Rx Q-data to obtain a data signal 760. The data signal may be output to the decoder 550 or another circuit.

The functions described above can be implemented in digital electronic circuitry, in computer software, firmware or hardware. The techniques can be implemented using one or more computer program products. Programmable processors and computers can be included in or packaged as mobile devices. The processes and logic flows can be performed by one or more programmable processors and by one or more programmable logic circuitry.

Some implementations can include electronic components, such as microprocessors, storage and memory that store computer program instructions in a machine-readable or computer-readable medium (alternatively referred to as computer-readable storage media, machine-readable media, or machine-readable storage media). Some examples of such computer-readable media include RAM, ROM, read-only compact discs (CD-ROM), recordable compact discs (CD-R), rewritable compact discs (CD-RW), read-only digital versatile discs (e.g., DVD-ROM, dual-layer DVD-ROM), a variety of recordable/rewritable DVDs (e.g., DVD-RAM, DVD-RW, DVD+RW, etc.), flash memory (e.g., SD cards, mini-SD cards, micro-SD cards, etc.), magnetic and/or solid state hard drives, ultra density optical discs, any other optical or magnetic media, and floppy disks. The computer-readable media can store a computer program that is executable by at least one processing unit and includes sets of instructions for performing various operations. Examples of computer programs or computer code include machine code, such as is produced by a compiler, and files including higher-level code that are executed by a computer, an electronic component, or a microprocessor using an interpreter.

Some implementations can be performed by a microprocessor or multi-core processors that execute software. Some implementations can be performed by one or more integrated circuits, such as application specific integrated circuits (ASICs) or field programmable gate arrays (FPGAs). In some implementations, such integrated circuits can execute instructions that are stored on the circuit itself.

Many of the above-described features and applications may be implemented as software processes that are specified as a set of instructions recorded on a computer readable storage medium (also referred to as computer readable medium). When these instructions are executed by one or more processing unit(s) (e.g., one or more processors, cores of processors, or other processing units), they cause the processing unit(s) to perform the actions indicated in the instructions. Examples of computer readable media include, but are not limited to, CD-ROMs, flash drives, RAM chips, hard drives, EPROMs, etc. The computer readable media does not include carrier waveforms and electronic signals passing wirelessly or over wired connections.

In this specification, the term "software" is meant to include firmware residing in read-only memory or applications stored in magnetic storage, which can be read into memory for processing by a processor. Also, in some implementations, multiple software aspects of the subject disclosure can be implemented as sub-parts of a larger program while remaining distinct software aspects of the subject disclosure. In some implementations, multiple software aspects can also be implemented as separate programs. Finally, any combination of separate programs that together implement a software aspect described here is within the scope of the subject disclosure. In some implementations, the software programs, when installed to operate on one or more electronic systems, define one or more specific machine implementations that execute and perform the operations of the software programs.

A computer program (also known as a program, software, software application, script, or code) can be written in any form of programming language, including compiled or interpreted languages, declarative or procedural languages, and it can be deployed in any form, including as a stand alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

The predicate words "configured to", "operable to", and "programmed to" do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

The word "example" is used herein to mean "serving as an example or illustration." Any aspect or design described herein as "example" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. An integrated chip (IC) package, comprising:
   a waveguide comprising a cavity;
   a first chip including a first radio frequency (RF) transceiver coupled to a first probe that extends into the cavity of the waveguide; and
   a second chip including a second RF transceiver coupled to a second probe that extends into the cavity of the waveguide;
   wherein the first and second chips are configured to communicate with one another exclusively by transmitting and receiving RF signals by the first and second RF transceivers through the cavity of the waveguide via the first and second probes; and
   wherein the first probe extends into the cavity of the waveguide at one-fourth of a wavelength of at least one of the RF signals from a first sidewall of the waveguide and the second probe extends into the cavity of the waveguide at a multiple of the wavelength of the at least one of the RF signals from the first probe.

2. The IC package of claim 1, wherein the waveguide comprises a second sidewall.

3. The IC package of claim 2, wherein at least one of the first sidewall or the second sidewall is shorted.

4. The IC package of claim 2, wherein the waveguide further comprises a first conductive layer and a second conductive layer having the cavity therebetween, wherein the first conductive layer is over the second conductive layer.

5. The IC package of claim 4, wherein the first chip and the second chip are mounted on a substrate over the first conductive layer and the second conductive layer.

6. The IC package of claim 4, wherein the cavity comprises a dielectric layer and the first sidewall and the second sidewall comprise at least one of a plurality of metal posts in the dielectric layer or metal plating along an edge of the dielectric layer.

7. The IC package of claim 2, further comprising:
   a third chip including a third RF transceiver coupled to a third probe that extends into the cavity of the waveguide at one-fourth of the wavelength of the at least one of the RF signals from the second sidewall.

8. The IC package of claim 1, wherein the first chip further includes an impedance matching circuit that matches an output impedance with an impedance of the first probe.

9. An integrated chip (IC) package, comprising:
   a waveguide comprising a cavity;
   a first chip including a first radio frequency (RF) transceiver coupled to a first antenna positioned over a first opening of the waveguide;
   a second chip including a second RF transceiver coupled to a second antenna positioned over a second opening of the waveguide; and
   a third chip including a third RF transceiver coupled to a third antenna positioned over a third opening of the waveguide;
   wherein the first, second, and third chips are configured to communicate with one another exclusively by transmitting and receiving RF signals by the first, second, and third RF transceivers through the cavity of the waveguide via the first, second, and third antennas; and
   wherein the first chip is configured to transmit the RF signals to a fourth chip, at least partially through the air external to the IC package, via a fourth opening of the waveguide, wherein the fourth chip is external to the IC package.

10. The IC package of claim 9, wherein the waveguide comprises a first conductive layer and a second conductive layer, the first conductive layer being over the second conductive layer.

11. The IC package of claim 10, wherein the first opening of the waveguide comprises a slot in the first conductive layer that radiates the RF signals to the first antenna as narrow RF beams.

12. The IC package of claim 10, wherein the first chip, the second chip, and the third chip are mounted on a substrate over the first conductive layer and the second conductive layer.

13. The IC package of claim 9, wherein the fourth opening in the waveguide allows the RF signals to propagate outside of the IC package through the air.

14. The IC package of claim 9, wherein the first chip is further coupled to a first probe that extends into the cavity of the waveguide, and the first chip is further configured to exclusively communicate with the second and third chips by the first RF transceiver injecting the RF signals into the cavity of the waveguide via the first probe and by the first RF transceiver receiving the RF signals through the cavity of the waveguide via the first antenna.

15. The IC package of claim 9, wherein the first, second, and third RF transceivers are configured to communicate with one another using at least one of time division multiplexing, frequency division multiplexing, code division multiplexing, or packet-based addressing.

16. An integrated chip (IC) package, comprising:
   a first conductive layer over a second conductive layer with a cavity therebetween; and a plurality of chips each comprising a radio frequency (RF) transceiver configured to transmit and receive radio frequency (RF) signals through the cavity;

wherein the plurality of chips of the IC package exclusively communicate with one another by transmitting and receiving the RF signals through the cavity; and wherein a first probe of a first chip of the plurality of chips extends into the cavity at one-fourth of a wavelength of at least one of the RF signals from a first sidewall of the cavity and a second probe of a second chip of the plurality of chips extends into the cavity at a multiple of the wavelength of the at least one of the RF signals from the first probe.

17. The IC package of claim 16, wherein one of the plurality of chips is configured to transmit a clock signal through the cavity to the other of the plurality of chips and the plurality of chips are configured to synchronize with one another based on the clock signal.

18. The IC package of claim 16, wherein a third chip of the plurality of chips comprises an antenna positioned over an opening in the first conductive layer.

19. The IC package of claim 16, wherein the plurality of chips are mounted on a substrate over the first conductive layer and the second conductive layer.

20. The IC package of claim 16, wherein the plurality of chips are configured to transmit and receive the RF signals to another chip, at least partially through the air external to the IC package, via an opening in the first conductive layer, wherein the another chip is external to the IC package.

* * * * *